(12) United States Patent
Ke et al.

(10) Patent No.: US 7,985,652 B2
(45) Date of Patent: Jul. 26, 2011

(54) METAL STRESS MEMORIZATION TECHNOLOGY

(75) Inventors: Chung-Hu Ke, Taipei (TW); Ta-Ming Kuan, Zhongli (TW); Chih-Hsin Ko, Fongshan (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 220 days.

(21) Appl. No.: 11/855,701

(22) Filed: Sep. 14, 2007

(65) Prior Publication Data

US 2009/0075442 A1   Mar. 19, 2009

(51) Int. Cl.
*H01L 21/8234* (2006.01)
(52) U.S. Cl. ........ 438/275; 438/199; 438/283; 438/682; 257/E21.056; 257/E21.177; 257/E21.438
(58) Field of Classification Search .......... 438/581, 438/583, 651, 721, 755, 181, 195; 257/E21.042, 257/E21.051, E21.056, E21.177, E21.37, 257/E21.4, E21.457, E21.574
See application file for complete search history.

(56) References Cited

U.S. PATENT DOCUMENTS

| 7,119,404 | B2  |    | 10/2006 | Chang et al. |         |
|-----------|-----|----|---------|--------------|---------|
| 7,372,108 | B2  | *  | 5/2008  | Iinuma       | 257/369 |
| 2006/0099745 | A1 | * | 5/2006 | Hsu et al.   | 438/149 |
| 2006/0286758 | A1 |   | 12/2006 | Liang et al. |         |
| 2007/0066001 | A1 | * | 3/2007 | Iinuma       | 438/199 |
| 2007/0128783 | A1 | * | 6/2007 | Ting et al.  | 438/199 |
| 2008/0296631 | A1 | * | 12/2008 | Chen et al. | 257/254 |
| 2009/0068824 | A1 | * | 3/2009 | Liu et al.  | 438/530 |

OTHER PUBLICATIONS

Detavernier, C., et al., "The Influence of Ti and TiN on the Thermal Stability of CoSi$_2$," Mat. Res. Soc. Symp. Proc., 2001, 6 pp., vol. 670, Materials Research Society, Warrendale, PA.

Plummer, J.D., et al., "Silicon VLSI Technology: Fundamentals, Practice and Modeling," 2000, pp. 734-737, Prentice-Hall, Inc., Upper Saddle River, NJ.

* cited by examiner

*Primary Examiner* — Cheung Lee
(74) *Attorney, Agent, or Firm* — Slater & Matsil, L.L.P.

(57) ABSTRACT

A semiconductor device and method for manufacturing a tensile strained NMOS and a compressive strained PMOS transistor pair, wherein a stressor material is sacrificial is disclosed. The method provides for a substrate, which includes a source/drain for an NMOS transistor, and a PMOS transistor. A first barrier layer is formed on the substrate and a first stressor material is formed on the first barrier layer. The first barrier layer is selectively removed from the PMOS transistor. The substrate is flash annealed and the remaining first stressor material and barrier layer is removed from the substrate.

14 Claims, 6 Drawing Sheets

METAL STRESS MEMORIZATION TECHNOLOGY

TECHNICAL FIELD

The present invention relates generally to semiconductor devices, and more particularly to a structure and a method for manufacturing a tensile strained NMOS and a compressive strained PMOS transistor pair.

BACKGROUND

Classical semiconductor scaling, typically known as a device shrink, is currently supplemented by effective scaling, using techniques such as stress memorization. With circuits becoming smaller and faster, improvement in device drive current ($I_{on}$) is becoming more important. Drive current is closely related to gate length, gate capacitance, and carrier mobility. Stress memorization techniques are being used to speed carrier mobility in transistor channels, enabling higher drive currents.

Stress or strain in a device may have components in three directions, parallel to the metal-oxide-semiconductor (MOS) device channel length, parallel to the device channel width, and perpendicular to the channel plane. The strains parallel to the device channel length and width are called in-plane strains. Research has revealed that a bi-axial, in-plane tensile strain field can improve NMOS (n-channel MOS transistor) performance, and compressive strain parallel to channel length direction can improve PMOS (p-channel MOS transistor) device performance.

One way to develop strain is by using a graded SiGe epitaxy layer as a substrate on which a layer of relaxed SiGe is formed. A layer of silicon is formed on the relaxed SiGe layer. MOS devices are then formed on the silicon layer, which has inherent strain. Since the lattice constant of SiGe is larger than that of Si, the Si film is under biaxial tension and thus the carriers exhibit strain-enhanced mobility. The lattice spacing mismatch between the SiGe layer causes the underlying layer to develop an in-plane stress to match the lattice spacing. This additional processing may add cost to the semiconductor device manufacturing process.

Strain can also be applied by forming a strained capping layer, such as a barrier layer, on a MOS device. However, the barrier layer may not produce sufficient stress to produce the desired results. The conventional method of forming strained capping layers, suffers drawbacks, and the effect is limited by the properties of the capping layer. For example, the thickness of the strained capping layer is limited due to the subsequent gap filling difficulty caused by the thick capping layer. Therefore, the strain applied by the capping layer is limited. In addition, forming a strained capping layer that has customized strains for different devices, such as PMOS and NMOS devices, is particularly complex and costly.

SUMMARY OF THE INVENTION

These and other problems are generally solved or circumvented, and technical advantages are generally achieved, by illustrative embodiments in which stress memorization layers within semiconductor devices and methods of manufacturing stress memorization layers within semiconductor devices are presented.

Semiconductor devices are manufactured by forming active regions in a semiconductor substrate, depositing various insulating, conductive, and semiconductive layers over the substrate, and patterning them in sequential steps. In accordance with an illustrative embodiment, a substrate is provided, which includes a source/drain for an NMOS transistor, and a PMOS transistor. A first barrier layer is formed on the substrate and a first stressor-material is formed on the first barrier layer. The first stressor-material and the first barrier layer is selectively removed from the PMOS transistor. The substrate may be flash annealed and the remaining first stressor-material and first barrier layer is removed from the substrate.

Another illustrative embodiment provides a substrate, wherein the substrate includes a source/drain for a NMOS transistor and a PMOS transistor, and wherein the substrate further includes a metal silicide layer. A second barrier layer is formed on the metal silicide layer. A second stressor-material is deposited on the second barrier layer. A second flash anneal is implemented and the stressor-material is removed from the substrate.

In accordance with yet another illustrative embodiment, a semiconductor device with enhanced carrier mobility comprises an NMOS device with a first stress value and a PMOS device with a second stress value, wherein a stressor layer is sacrificial.

An advantage of the illustrative embodiments of the present invention is enhanced carrier mobility and increased transistor drive current. A further advantage of the illustrative embodiments of the present invention is a low cost implementation of a stress configuration, which may be optimized for increased transistor drive current.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a CMOS configuration. The invention may also be applied, however, to bipolar and bi-CMOS structures.

An illustrative embodiment shows a stress memorization technique that may stress the film, then activate the dopants causing an impurity rearrangement; stress the film and control poly grain growth; and/or stress the film and form silicide. Another illustrative embodiment may thermally stress the film during dopant activation, poly grain growth, and silicidation.

The stress in the film due to differences in thermal expansion coefficients is $$\sigma_f = ((\alpha_s - \alpha_f) \Delta T (Y_f / 1 - v_f))$$

where $\sigma_f$ is thermal stress, $Y_f$ is Young's modulus, $v_f$ is Poisson's ratio, $\alpha_s$ is the substrate coefficient of thermal expansion and $\alpha_f$ is the film coefficient of thermal expansion. The illustrative embodiments present a method of using the differences in thermal expansion between materials to stress semiconductor active regions during substrate processing.

Figure 1:
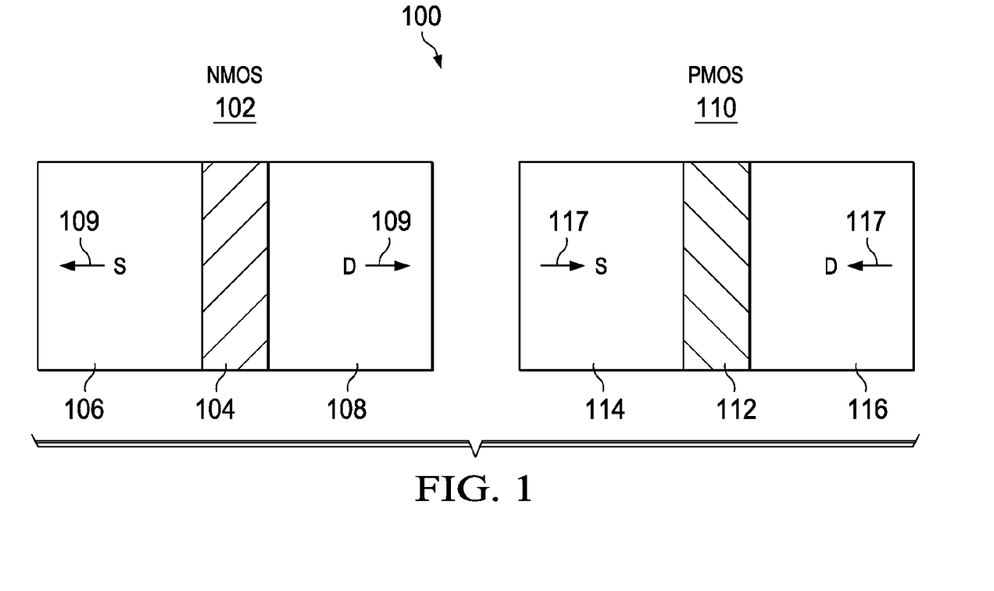
FIG. 1 is a diagram of preferred NMOS and PMOS stress configurations.

With reference now to FIG. 1, there is shown a diagram of illustrative NMOS and PMOS stress configurations. The substrate 100 may comprise silicon or other semiconductor material covered by an insulating layer, for example. The substrate 100 may also include other active components or circuits formed in the front end of line (FEOL), not shown. The substrate 100 may comprise silicon oxide over single-crystal silicon, for example. The substrate 100 may include other conductive layers or other semiconductor elements, e.g. transistors, diodes, etc. Compound semiconductors, GaAs, InP, Si/Ge, or SiC, as examples, may be used in place of silicon.

NMOS transistor 102 has an N-channel region 104 and source drain regions 106 and 108, respectively. NMOS transistor 102 displays increased electron mobility if the N-channel region 104 of the transistor is under tensile strain, as indicated by arrows 109. Moving the silicon atoms farther apart reduces the atomic forces that interfere with the movement of electrons through the transistors, subsequently resulting in better semiconductor device performance and lower energy consumption.

PMOS transistor 110 has a P-channel region 112 and source drain regions 114 and 116 respectively. The PMOS transistor displays increased hole mobility, if the p-channel region is under compressive stress, indicated by arrows 117.

To create the regions with sufficient stress in the NMOS and PMOS channel regions, a combination of stress techniques may be used with a better effect than a single technique. The mechanical stress of a stressor layer on the active channel plus the thermal stress of processing may be applied at more than one step in the semiconductor manufacturing process. The stress produced by multiple techniques is additive. Therefore, the device characteristics produced by additive techniques may show an enhanced improvement.

Figure 2:
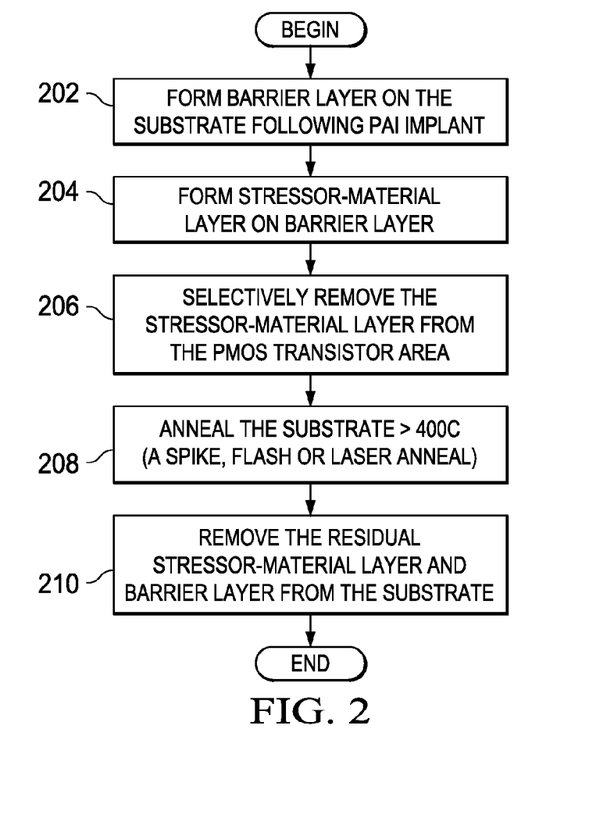
FIG. 2 is a process flow illustrating an embodiment of a thermal/mechanical stress memorization method during dopant activation anneal.

FIG. 2 is a process flow illustrating an embodiment of a thermal/mechanical stress memorization method. A semiconductor substrate is provided, such as substrate 100 in FIG. 1, which includes active and inactive regions. Within the active regions, the NMOS and PMOS devices are defined. The process begins following the spacer formation and implantations of the source drain areas of the NMOS and PMOS structures. An optional pre-amorphization implant (PAI) utilizing a neutral ion, such as silicon (Si), germanium (Ge), and/or xenon (Xe) may be performed. As an example, Ge ions are accelerated to an energy appropriate to form amorphous regions in targeted areas. Ion implantation devices, such as, devices manufactured by Varian Company, Palo Alto, Calif., Genius Company, and Applied Materials, Inc. can be used to provide the amorphization implant as well as the dopant implants. The PAI process may be selectively performed on NMOS transistor structures.

Following the processes above, a barrier layer is formed (step 202). The barrier layer may be formed of $SiO_2$. In another embodiment, the barrier layer may be comprised of, for an example, a layer of low-temperature and high tensile nitride ($Si_3N_4$) film. The stress level of a nitride film may be adjusted by the type of starting material used to make the nitride film and the type of nitrogen-containing gas treating the starting material. The set of chemical vapor deposition (CVD) conditions under which the film is grown and/or a thickness to which the film is grown also determines the stress level of the nitride film. An ammonia-treated BTBAS film may provide a high-stress property, and may maintain the stress property during anneal. Relying on the stress level of a nitride film alone, however, may not be sufficient to produce the desired stress levels in the silicon device. Therefore, a stressor-material may be formed on the barrier layer to provide additional stress.

A stressor-layer formation (step 204) follows the barrier layer formation. The stressor-material layer may be a metal or metal combination such as, for example, TiN, Co, Ni, W, Ti, Ta, Mo, and the like. The thermal expansion coefficient of the stressor-material layer may be greater than the thermal expansion coefficient of Silicon by 20%. See the table of thermal expansion coefficients listed below:

| Material | Thermal expansion coefficient - $\alpha$ ($10^{-6}$ $K^{-1}$) |
|---|---|
| TiSi2 | 12.5 |
| CoSi2 | 10.4 |
| NiSi | 16.0 |
| Si | 2.3 |
| SiO2 | 0.5 |
| TiN | 9.3 |
| Si3N4 | A FUNCTION OF FORMATION AND THICKNESS TYPICALLY < 4.0 |

The stressor-material layer and the barrier layer may then be selectively removed from the PMOS region (step 206). Optionally the barrier layer may stay in place over the PMOS region.

The substrate is annealed at a temperature preferably greater than 400 C. (step 208). The anneal may be a spike, flash, or laser anneal. The differences between spike, flash and laser anneal processes are known in the art and may be seen in temperature versus time graphs.

Following anneal, the residual barrier layer and stressor-material layer may be removed (step 210). Thereinafter, the substrate may continue conventional processing.

Figure 3A:
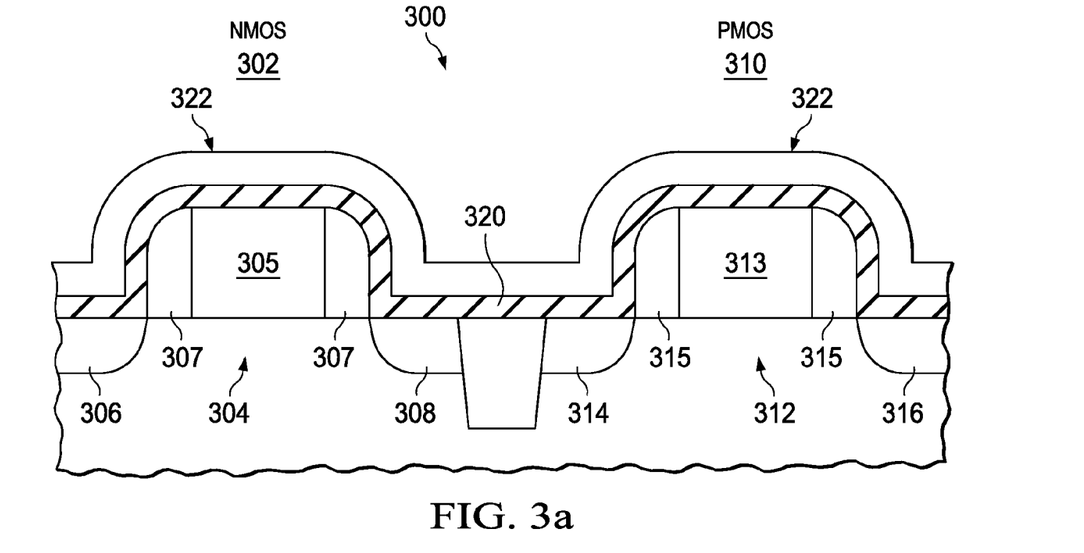
FIG. 3 shows cross-sectional views of a substrate undergoing an embodiment of a thermal/mechanical stress memorization method during dopant activation anneal.
Figure 3B:
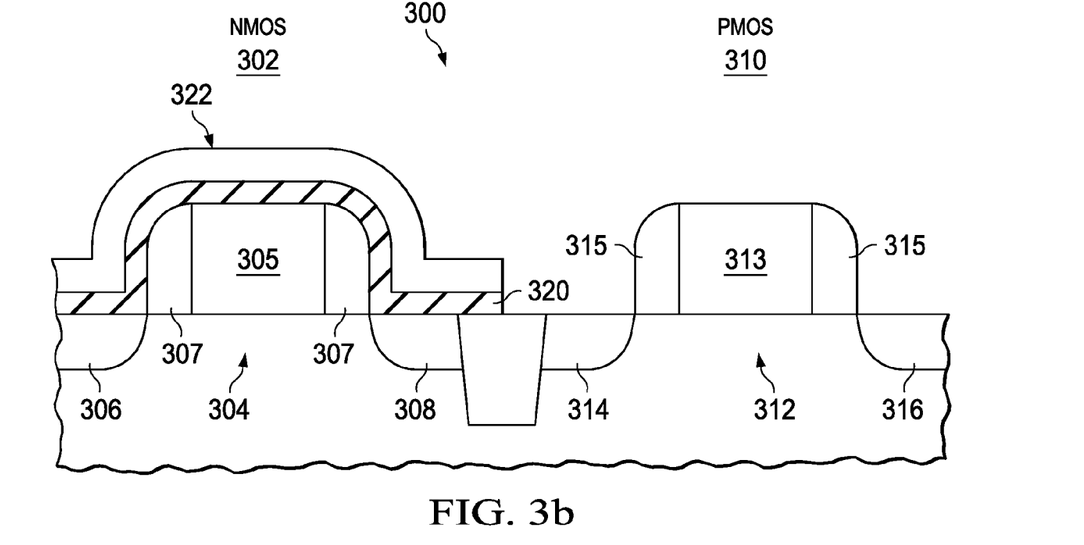
Figure 3C:
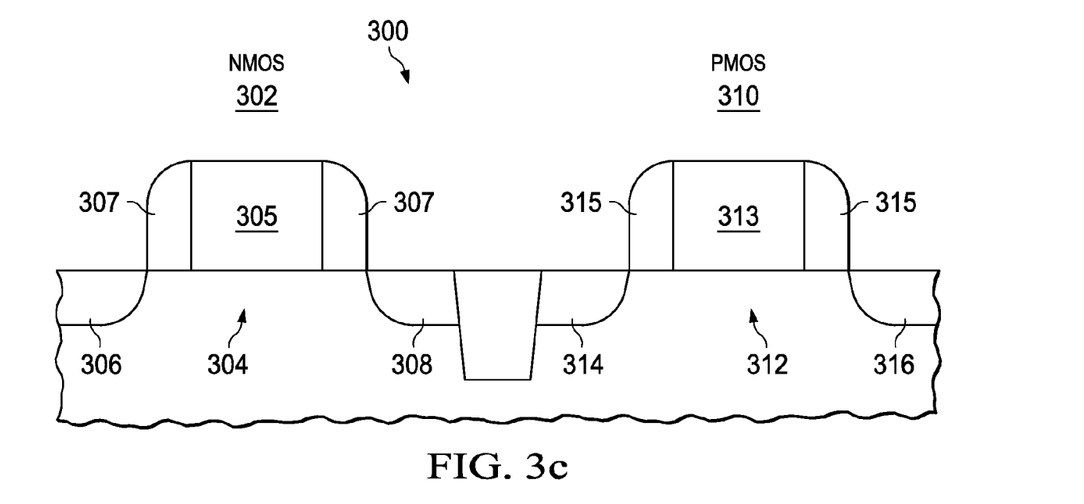

FIGS. 3a-3c are cross-sectional views of an illustrative embodiment of the process steps presented in FIG. 2. FIG. 3a illustrates a cross-sectional view of substrate 300 following a stressor-material layer formation, such as step 204 in FIG. 2.

Substrate 300 is a semiconductor device substrate such as substrate 100 in FIG. 1. NMOS transistor 302 has an N-channel region 304, gate stack 305, spacers 307, and source drain regions 306 and 308, respectively. PMOS transistor 310 has a P-channel region 312, gate stack 313, spacers 315, and source drain regions 314 and 316 respectively. A barrier layer 320 is deposited on the NMOS transistor region 302 and the PMOS transistor region 310. Layered over the barrier layer 320, a stressor-material layer 322 is disposed.

FIG. 3b shows a cross-sectional view of the NMOS and PMOS transistor regions following a selective removal step such as selective removal step 206 of FIG. 2. The cross-sectional view shows the PMOS region 310 with barrier layer 320 and the stressor-material layer 322 selectively removed. The selective removal of barrier layer 320 and stressor-material layer 322 on PMOS 310 may be performed to alleviate stress-induced device degradation. The barrier layer 320 and the stressor-material layer 322 remain on the NMOS substrate area. The thermal anneal, such as step 208 of FIG. 2, may be accomplished with the barrier layer 320 and the stressor-material layer 322 configured as shown in FIG. 3b.

FIG. 3c illustrates substrate 300 following the removal of the residual stressormaterial layer 322 and barrier layer 320. It should be noted that the stressor-material layer and barrier layer may be sacrificial layers in this embodiment.

Figure 4:
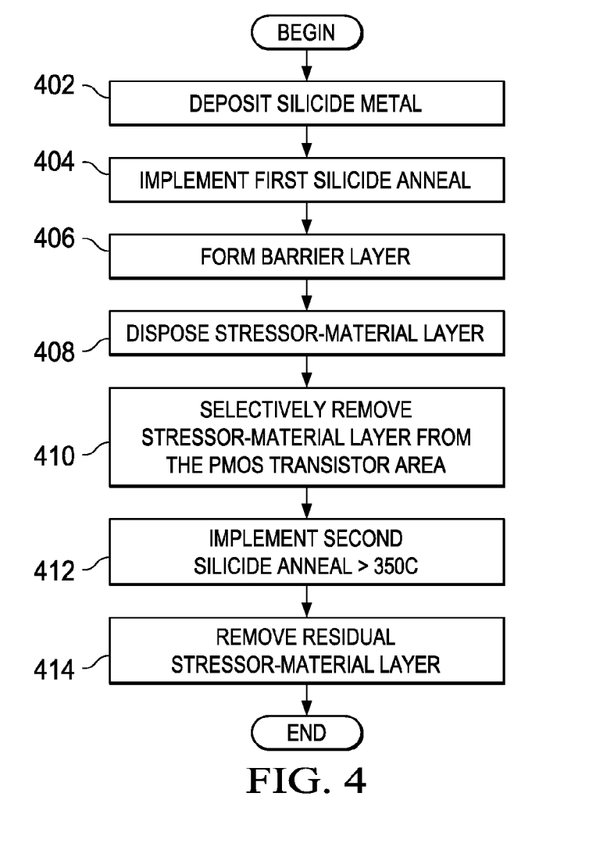
FIG. 4 is a process flow illustrating another embodiment of a thermal/mechanical stress memorization method during second silicide anneal.

FIG. 4 is a process flow illustrating another embodiment of a thermal/mechanical stress memorization method. The process begins with a silicide metal deposition (step 402). Titanium silicide ($TiSi_2$) is a common silicide and is an example of a silicide that may be used. Other silicides that may be used include $CoSi_2$, $TaSi_2$, $MoSi_2$, $Ni_xSi_y$, and PtSi. Silicides may be used in CMOS technology to reduce sheet resistance of polysilicon lines and n+ regions. The formation of silicides can be done in two general ways: by direct deposition of the silicide or by deposition of the metal on top of Si followed by the reaction between the metal and Si to form the silicide. The direct deposition method can be accomplished, as an example, by sputtering from a composite target, co-sputtering from two targets of the metal and Si, co-evaporation of the metal and Si, and CVD. These methods are within the scope of the illustrative embodiments.

However, the reaction method is implemented in this embodiment. The metal, Ti for example, may be deposited by sputtering on the exposed gate and/or source drain regions, all of which are silicon. The unreacted metal is then selectively etched away. This method produces self-aligned silicide structures on the gate and/or source drains.

The substrate undergoes a first silicide anneal (step 404), and the silicide forming reaction occurs wherever the silicon and metal are in contact, that is in this example, on the gate and source/drain regions. Separate silicidation steps, such as silicidation of the source/drain regions separately from the gate stack regions are known within the art and are within the scope of these embodiments. The first silicide anneal is followed by a barrier layer formation (step 406). The barrier layer may be comprised of a $SiO_2$ or a $Si_3N_4$. A stressor-material layer is then disposed (step 408). The stressor-material layer may be a metal or metal combination such as, for example, TiN, Co, Ni, W, Ti, Ta, Mo, and the like. The stressor material may have a thermal expansion coefficient greater by 20% than the thermal expansion coefficient of silicon. The stressor-material may have a thermal expansion coefficient greater than the silicide layer.

The stressor-material layer is selectively removed from the PMOS (step 410). The substrate undergoes a second silicide anneal (step 412). The second silicide anneal step may be implemented in a spike, flash, or laser anneal. The second silicide anneal is preferably implemented at a temperature greater than 350 C. and greater than the first silicide anneal. Thereinafter the substrate may continue conventional processing.

Figure 5A:
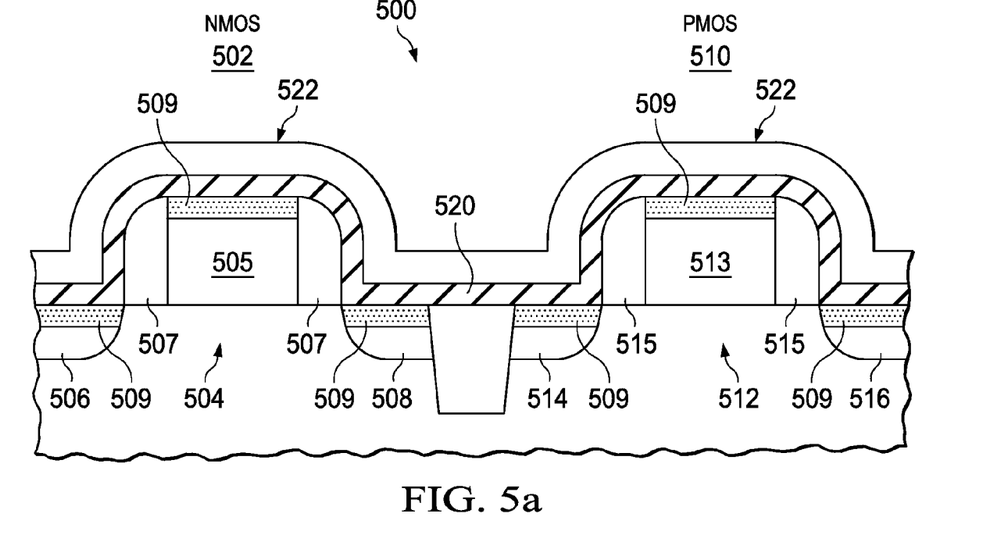
FIG. 5 shows cross-sectional views of a substrate undergoing another embodiment of a thermal/mechanical stress memorization method during second silicide anneal.
Figure 5B:
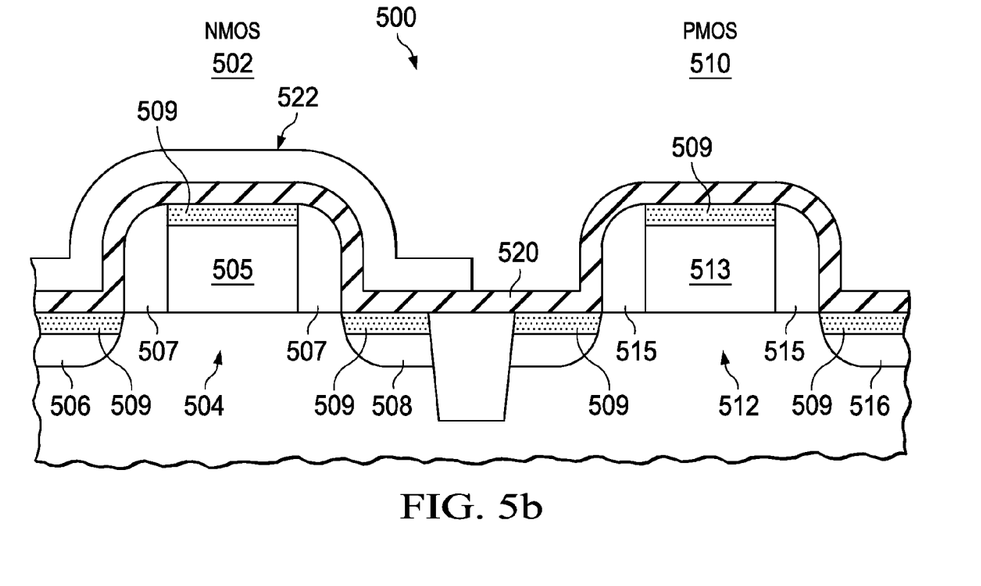
Figure 5C:
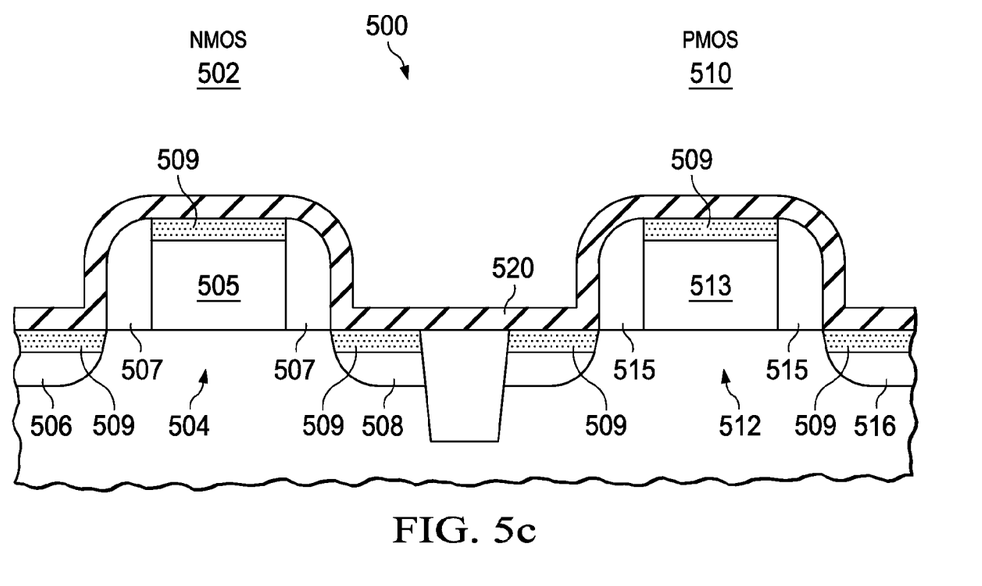

FIGS. 5a-5c show cross-sectional views of a substrate undergoing another embodiment of a thermal/mechanical stress memorization method. Turning to FIG. 5a, substrate 500 is a semiconductor device substrate such as substrate 100 in FIG. 1. NMOS transistor 502 has an N-channel region 504, gate stack 505, spacers 507, and source drain regions 506 and 508, respectively. Gate stack 505 and source drain regions 506 and 508 show silicided regions 509. PMOS transistor 510 has a P-channel region 512, gate stack 513, spacers 515, and source drain regions 514 and 516 respectively. Gate stack 513 and source drain regions 514 and 516 show silicided regions 509. A barrier layer 520 is deposited on the NMOS transistor region 502 and the PMOS transistor region 510, as in step 406 of FIG. 4. Layered over the barrier layer 520, a stressor-material layer 522 is disposed, as in step 408 of FIG. 4.

FIG. 5b shows a cross-sectional view of the NMOS and PMOS transistor regions following a selective removal step such as selective removal step 410 of FIG. 4. The cross-sectional view shows the PMOS region 510 with barrier layer 520 and the stressor-material layer 522 selectively removed. The selective removal of barrier layer 520 and stressor-material layer 522 on PMOS 510 may be performed to alleviate stress-induced device degradation in the PMOS transistor. The barrier layer 520 and the stressor-material layer 522 remain on the NMOS substrate area. The second silicide anneal, such as step 412 of FIG. 4, may be accomplished with the barrier layer 520 and the stressor-material layer 522 configured as shown in FIG. 5b.

FIG. 5c illustrates substrate 500 following the removal of the residual stressor-material layer 522. It should be noted that the stressor-material layer may be a sacrificial layer in this embodiment. However, the barrier layer 520 remains in place.

Figure 6:
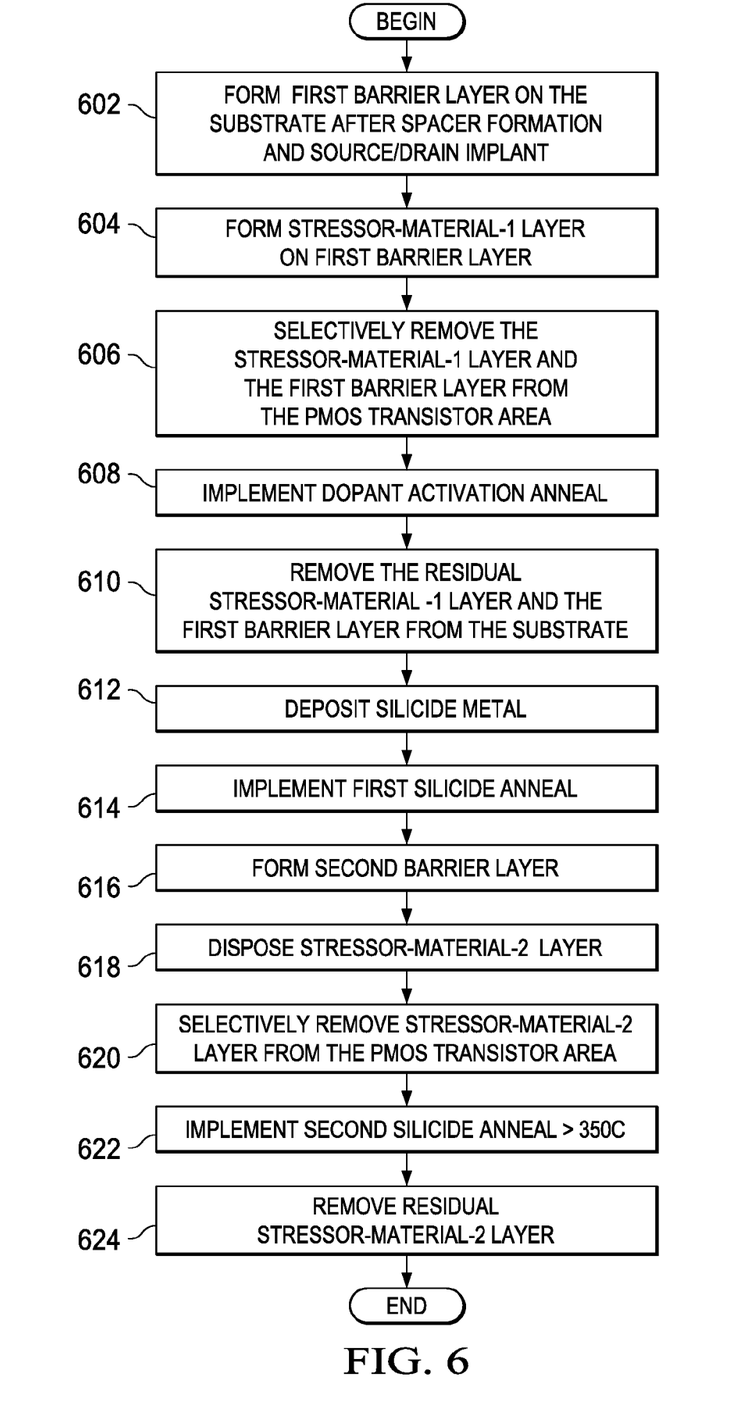
FIG. 6 is a process flow illustrating yet another embodiment of a thermal/mechanical stress memorization method during dopant activation anneal and second silicide anneal.

FIG. 6 is a process flow illustrating yet another embodiment of a thermal mechanical stress memorization method. This embodiment adds the stress memorized from a first embodiment discussed above to the stress created by a second embodiment discussed above. The stress effect is additive. The process-induced stress significantly influences the transistor device performance.

The process begins following spacer formation and source drain implants. A pre-amorphous implant (PAI) may optionally be included in the process. A first barrier layer is formed (602). The first barrier layer may be a $SiO_2$ layer or a $Si_3N_4$ layer such as layer 320 in FIG. 3. Next, a stressor-material-1 layer is formed on the first barrier layer (step 604). The stressor-material-1 may be Co, Ni, W, Ti, Ta, Mo, or the like. The selective removal of the stressor-material-1 and barrier layer on PMOS structure follows (step 606). The polysilicon is annealed and source/drain regions are activated in dopant activation anneal (step 608). The residual stressor-material-1 layer and first barrier layer is then removed (step 610). A metal deposited for silicide formation (612) follows, such as the metal deposited in step 402 in FIG. 4. The first silicide anneal is implemented (step 614), such as the first silicide anneal in step 404 of FIG. 4. On top of the silicide layer, a second barrier layer is formed (step 616). A stressor-material is then deposited (step 618). The stressor-material layer is then selectively removed (step 620) from the PMOS transistor region. The second silicide anneal is implemented (step 622), such as step 412 in FIG. 4. The residual stressor-material-2 layer is then removed (step 624), thus ending the process.

Although the present invention and its advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that film thicknesses may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device comprising:
   providing a substrate, wherein the substrate includes a source/drain for an NMOS transistor and a source/drain for a PMOS transistor;
   forming a first barrier layer on the substrate;
   forming a first stressor-material on the first barrier layer;
   selectively removing the first stressor-material from the PMOS transistor;
   selectively removing the first barrier layer from the PMOS transistor;
   annealing the substrate in a dopant activation anneal;
   removing the remaining first stressor-material;
   removing the remaining first barrier layer, thereby implementing a first stress process;
   following the first stress process, forming a second barrier layer on a metal silicide layer formed on the substrate;
   depositing a second stressor-material on the second barrier layer;
   performing a second silicide anneal on the substrate; and
   selectively removing the second stressor-material.

2. The method of claim 1, wherein the dopant activation anneal is implemented at a temperature higher than 400° C.

3. The method of claim 2, wherein the dopant activation anneal is selected from a group consisting of a spike anneal, a flash anneal, and a laser anneal.

4. The method of claim 1, wherein the first stressor-material has a thermal expansion coefficient ($\alpha$) greater than a thermal expansion coefficient of silicon ($\alpha_{si}$) by at least 20%.

5. The method of claim 1, wherein the first barrier layer is selected from a group consisting of oxide, nitride, oxynitride, and combinations thereof.

6. The method of claim 1, further comprising:
   implanting a pre amorphizing implantation into the NMOS transistor before forming the first barrier layer.

7. The method of claim 6, wherein the pre amorphizing implantation is implemented with a species selected from a group consisting of Si, Ge, and Xe ions.

8. The method of claim 1, wherein the second stressor-material is selected from a group consisting of Co, Ni, W, Ti, Ta, and Mo.

9. The method of claim 1, wherein the metal silicide, layer is chosen from a group consisting of nickel silicide, cobalt silicide, and titanium silicide.

10. The method of claim 1, wherein the second silicide anneal is implemented at a temperature higher than 350° C.

11. The method of claim 1, wherein the second silicide anneal is implemented at a temperature higher than an implemented first silicide anneal.

12. The method of claim 1, wherein the second silicide anneal is selected from a group consisting of a spike anneal, a flash anneal, and a laser anneal.

13. A method of manufacturing a semiconductor device comprising:
   providing a substrate;
   forming a barrier layer on the substrate;
   disposing a stressor-material on the barrier layer, wherein the stressor-material has a metal material with a thermal expansion coefficient ($\alpha$) greater than a thermal expansion coefficient of silicon ($\alpha_{si}$) by at least 20%;
   selectively removing the stressor-material;
   performing an anneal on the substrate;
   removing the residual stressor-material;
   removing the barrier layer to complete a first stress process;
   following the first stress process, forming a second barrier layer on a metal silicide layer formed on the substrate;
   depositing a second stressor-material on the second barrier layer;
   performing a second silicide anneal on the substrate; and
   selectively removing the second stressor-material.

14. The method of claim 13, further comprising:
   implanting a pre amorphizing implantation into the semiconductor device before forming the barrier layer.

* * * * *